United States Patent
Oh

(10) Patent No.: US 7,132,345 B2
(45) Date of Patent: Nov. 7, 2006

(54) METHOD FOR FABRICATING FLASH MEMORY DEVICE

(75) Inventor: Sang Hun Oh, Bucheon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 72 days.

(21) Appl. No.: 11/026,610

(22) Filed: Dec. 30, 2004

(65) Prior Publication Data

US 2005/0142752 A1    Jun. 30, 2005

(30) Foreign Application Priority Data

Dec. 31, 2003   (KR) .................... 10-2003-0101485

(51) Int. Cl.
*H01L 21/20* (2006.01)
(52) U.S. Cl. .............. 438/397; 438/253; 438/665
(58) Field of Classification Search ............. 438/253, 438/255, 396, 397, 398, 665, 964
See application file for complete search history.

(56) References Cited

U.S. PATENT DOCUMENTS

| | | | |
|---|---|---|---|
| 5,089,867 A | 2/1992 | Lee | |
| 5,424,569 A | 6/1995 | Prall | |
| 5,464,791 A * | 11/1995 | Hirota | ............ 438/253 |
| 6,323,514 B1 | 11/2001 | Kao | |
| 6,635,532 B1 | 10/2003 | Song et al. | |
| 6,768,681 B1 | 7/2004 | Kim | |
| 2001/0009799 A1 | 7/2001 | Ping | |
| 2003/0003662 A1 | 1/2003 | Suzuki | |
| 2003/0017666 A1 | 1/2003 | Quelrolo et al. | |
| 2004/0152260 A1 | 8/2004 | Rabkin et al. | |

FOREIGN PATENT DOCUMENTS

| | | |
|---|---|---|
| JP | 2003-142612 | 5/2003 |
| KR | 1020020096747 A | 12/2002 |
| WO | WO 02/45175 A1 | 6/2002 |

OTHER PUBLICATIONS

Peter Rabkin, Hsingya Arthur Wang and Kai-Chang Chou; Floating Gate Having Uneven Surface, Nonvolatile Memory Cell Having Control Gate and Its Manufacturing Method; Patent Abstracts of Japan; Publication No. 2003-142612; May 16, 2003; Japan Patent Office, Japan.

* cited by examiner

*Primary Examiner*—Phuc T. Dang
(74) *Attorney, Agent, or Firm*—Andrew D. Fortney

(57) ABSTRACT

A flash memory device fabrication method is disclosed. A disclosed method comprises: depositing a first oxide layer on a substrate; depositing a first polysilicon layer on the first oxide layer; forming a second oxide layer on the entire surface of the first polysilicon layer; removing the second oxide layer; making the first polysilicon layer with an embossed shape by performing a heat treatment; depositing a dielectric layer on the top of the first polysilicon layer; depositing a second polysilicon layer on the entire surface of the dielectric layer; and removing some parts of the dielectric layer and the second polysilicon layer through a patterning process and an etching process.

18 Claims, 3 Drawing Sheets

METHOD FOR FABRICATING FLASH MEMORY DEVICE

FIELD OF THE INVENTION

The present disclosure relates to a flash memory device and, more particularly, to a method for increasing a coupling ratio by enlarging the area between a floating gate and a control gate.

BACKGROUND

Generally, semiconductor memory devices are divided into volatile memories and nonvolatile memories. The volatile memories, including chiefly random access memories (RAM) such as dynamic random access memories (DRAM) and static random access memories (SRM), retain their memory data when power is turned on, but lose the stored data when the power is turned off. In contrast, the nonvolatile memories, including chiefly read only memories (ROM), retain their memory data even after the power is turned off.

The nonvolatile memories may be subdivided into ROM, programmable ROM (PROM), erasable PROM (EPROM), and electrically erasable PROM (EEPROM).

From the view point of process technology, the nonvolatile memories may be divided into a floating gate family and a metal insulator semiconductor (MIS) family comprising a multi-layer of two or more dielectrics. The memory devices of the floating gate family use potential wells to achieve memory characteristics. For instance, EPROM tunnel oxide (ETOX) structure and split gate structure are widely applied to flash EEPROM. The split gate structure comprises two transistors in one cell. On the other hand, the memory devices of the MIS family perform memory functions by using traps positioned on a bulk dielectric, the interface between dielectrics, and the interface between the dielectric and the semiconductor. At present, the MONOS (metal oxide nitride oxide semiconductor)/SONOS (semiconductor oxide nitride oxide semiconductor) structure is chiefly being employed for the flash EEPROM.

FIG. 1 is a cross-sectional view of a flash memory cell structure formed by a conventional technology. Referring to FIG. 1, a gate oxide layer 12 is deposited on a semiconductor substrate 10 having at least one device isolation layer 11. A first polysilicon layer 13 is deposited on the gate oxide layer 12. The first polysilicon layer 13 is used as a floating gate. A dielectric layer 15 and a second polysilicon layer 16 are sequentially deposited on the first polysilicon layer 13. The second polysilicon layer 16 is used as a control gate. A metal layer 17 and a nitride layer 18 are sequentially deposited on the second polysilicon layer 16. Next, some portion of the gate oxide layer 12, the first polysilicon layer 13, the dielectric layer 15, the second polysilicon layer 16, the metal layer 17, and the nitride layer 18 are removed in cell structure to complete a flash memory cell.

The above-mentioned flash memory cell has a floating gate and a control gate of flat-plate type. Generally, in a flash memory, electric potential of a control gate has to be thoroughly transferred into a floating gate to enhance the erase and program characteristics of a device. For example, when a flash memory performs the program function using hot carriers, the voltages of 0 V, 5 V, and 9V are applied to a source, a drain, and a control gate, respectively. Here, if the voltage applied to the control gate is thoroughly transferred to a gate oxide via a floating gate and forms an electric field, hot electrons are more rapidly injected into the floating gate. Contrarily, when the flash memory performs the erase function, the voltages of −7 V and 5 V are applied to the control gate and the source, respectively. In this case, electrons in the floating gate move toward the source by Fowler-Nordheim (F-N) tunneling. Here, if the capacitance between the control gate and the floating gate is high and the capacitance between the floating gate and a substrate is low, the voltage of the floating gate is maintained at a very low value and, therefore, the more electrons move toward the source to increase the erase speed. In conclusion, in performing the program or erase function, the smaller the voltage difference between the floating gate and the control gate becomes, the faster the operation speed of the flash memory becomes.

To improve the program and erase characteristics of a semiconductor device, a method of using a material with high dielectric constant as a dielectric layer between the floating gate and the control gate has been suggested. However, the suggested method is in progress at present and requires more technical development.

In order to improve the program and erase characteristics of a semiconductor device, other methods of increasing the capacitance by enlarging the surface area between the control gate and the floating gate are put to practical use. For example, an OSC (One Cylinder Storage) structure or a DCS (Double Cylinder Storage) structure is employed to increase the capacitance of capacitors. However, such prior arts require complicated fabrication processes and have a difficulty in maintaining constant capacitance as the level of integration degrees changes. In addition, as the floating gate three-dimensionally is completed, the large surface area between the floating gate and the substrate may degrade the program and erase characteristics of a semiconductor device. Thus, a method for fabricating a structure is required which can increase the area between the control gate and the floating gate without changing the area between the floating gate and the substrate.

Korean Patent Publication No. 2002-96747 discloses a flash memory fabrication method. In particular, the method increase the area between a control gate and a floating gate by placing an embossed layer made of HSG (Hemisphere Shaped Grains) therebetween, therefore maximizing the capacitance.

PCT Publication No. WO245,175 discloses another flash memory fabrication method. In particular, the method places a convex-concave shaped layer after deposition of amorphous polysilion on a substrate through a CVD (Chemical Vapor Deposition) process, thereby increasing a coupling ratio.

However, such methods for forming the embossed layer made of HSG and the convex-concave shaped layer require additional processes such as a deglaze process and, therefore, the fabrication processes become complicated.

SUMMARY OF THE INVENTION

Accordingly, the present invention is directed to a flash memory device fabrication method that substantially obviates one or more problems due to limitations and disadvantages of the related art.

An object of the present invention is to provide a flash memory device which improves erase and program characteristics by increasing a coupling ratio through enlarging the area between a floating gate and a control gate.

To achieve these objects and other advantages and in accordance with the purpose of the invention, as embodied and broadly described herein, the present invention provides a method of fabricating a flash memory device comprising: depositing a first oxide layer on a substrate; depositing a first polysilicon layer on the first oxide layer; forming a second oxide layer on the entire surface of the first polysilicon layer; removing the second oxide layer; making the first polysilicon layer with an embossed shape by performing a heat treatment; depositing a dielectric layer on the top of the first polysilicon layer; depositing a second polysilicon layer on the entire surface of the dielectric layer; and removing some parts of the dielectric layer and the second polysilicon layer through a patterning process and an etching process.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE PREFERRED EMBODIMENT

Reference will now be made in detail to the preferred embodiments of the present invention, examples of which are illustrated in the accompanying drawings.

FIGS. 2a through 2e are cross-sectional views illustrating an example method for fabricating a flash memory device in accordance with the present invention.

Figure 1:
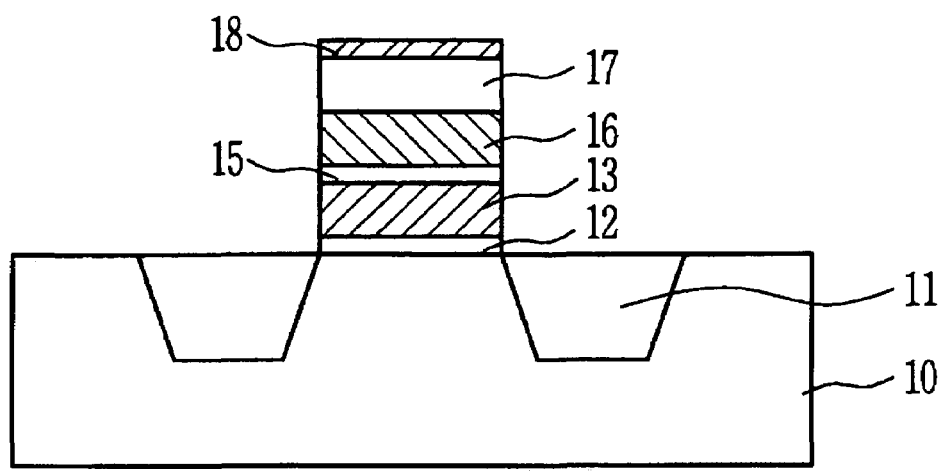
FIG. 1 is a cross-sectional view of a flash memory cell structure formed by a conventional technology.
Figure 2A:
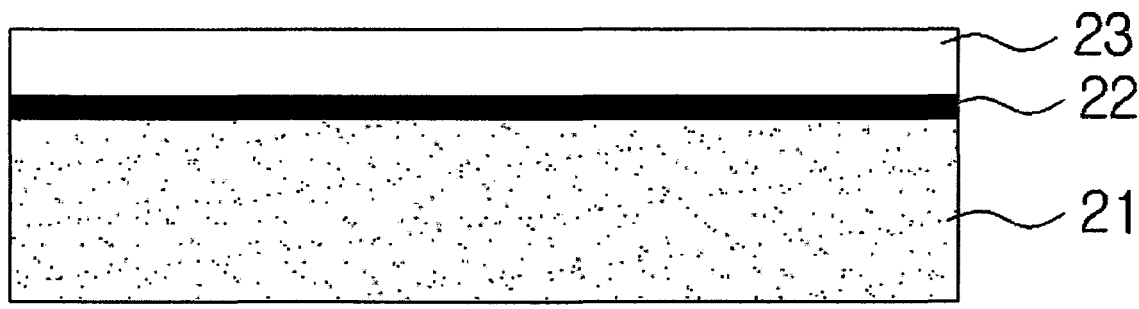
FIGS. 2a through 2e are cross-sectional views illustrating an example method for fabricating a flash memory device in accordance with the present invention.

Referring to FIG. 2a, a first oxide layer 22 for a tunnel layer is deposited on a substrate 21. Subsequently, a first polysilicon layer 23 for a floating gate is deposited on the entire surface of the first oxide layer 22. The first oxide layer 22 has a thickness between 50 nm and 100 nm by a thermal oxidation process.

Figure 2B:
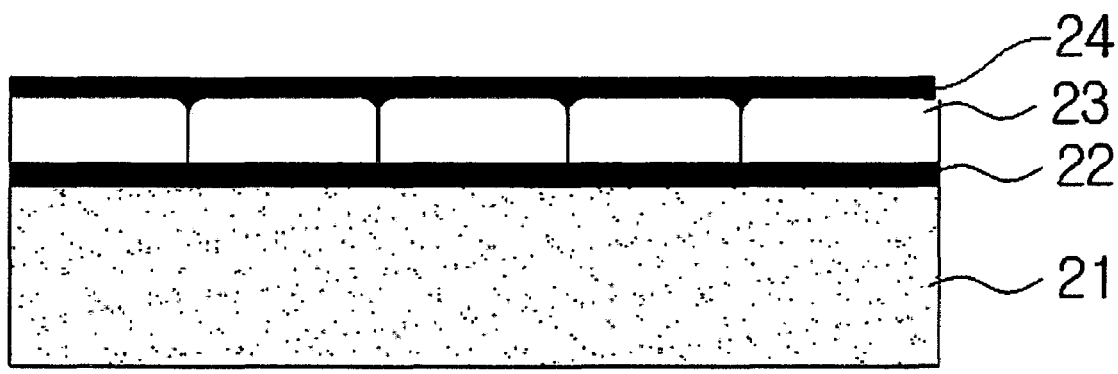

Referring to FIG. 2b, the first polysilicon layer 23 is then oxidized and, therefore, a second oxide layer 24 is formed on the surface of the oxidized first polysilicon layer 23 and between grain boundaries thereof.

Figure 2C:
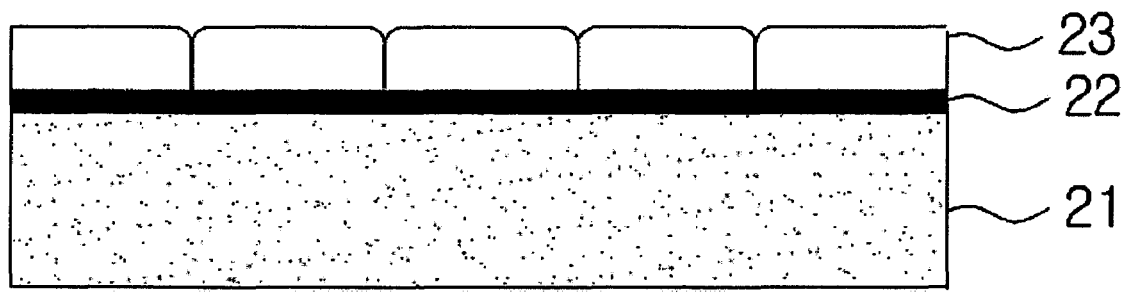

Referring to FIG. 2c, the second oxide layer is removed by HF vapor gas. The HF vapor gas is a mixture gas of HF and DIW (DeIonised Water). The concentration of the HF is preferably between 20% and 30%. The HF vapor gas etches the grain boundaries faster than the surface of the first polysilicon layer 23.

Figure 2D:
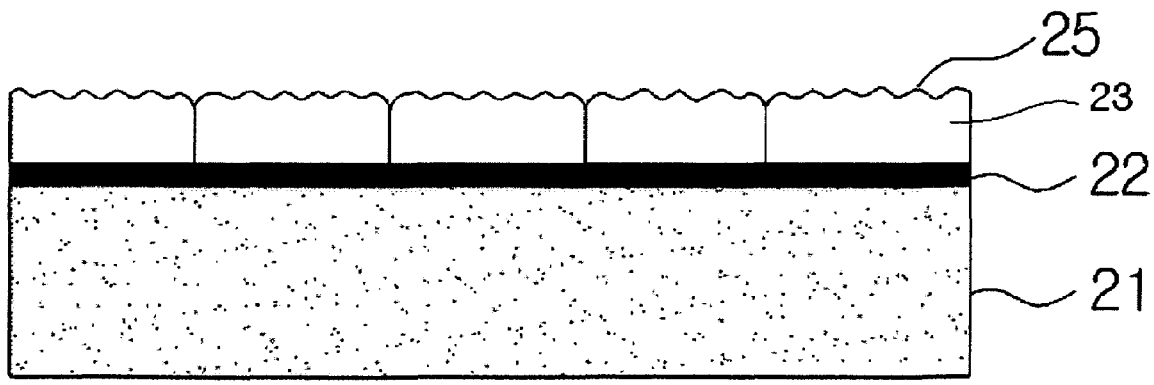

Referring to FIG. 2d, an in-situ high-temperature vacuum heat treatment is performed for the resulting structure, thereby forming the first polysilicon layer 23 with an embossed surface. The high-temperature vacuum heat treatment is performed at a temperature between 600° C. and 700° C. in a chamber keeping a pressure about 12 mT for 1 hour to 4 hours. Preferably, the high-temperature vacuum heat treatment is performed at a temperature of 650° C. in a chamber keeping a pressure about 10 mT for 2 hours to 3 hours. Through the high-temperature vacuum heat treatment, the embossed shape is formed on the top surface of the first polysilicon 23 and the lateral faces of the grain boundaries, thereby increasing the surface area by 2 to 3 times compared to the flat surface area.

Figure 2E:
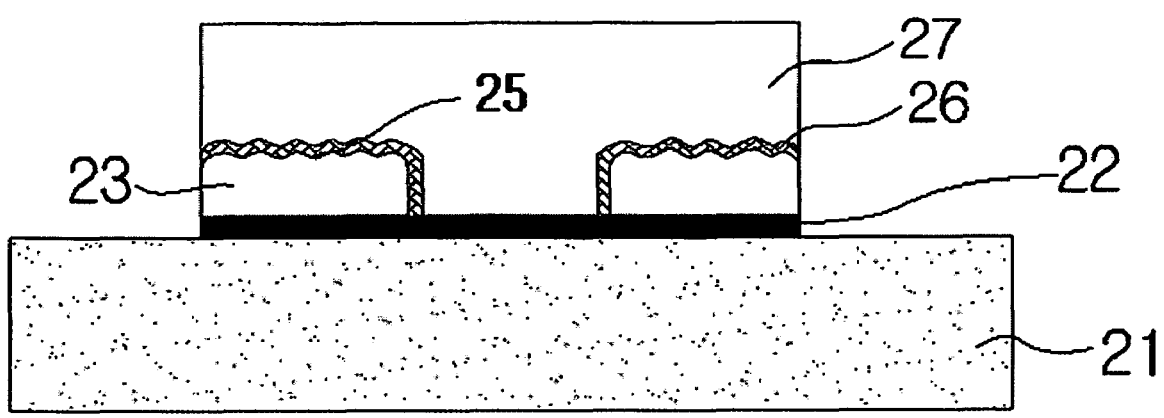

Referring to FIG. 2e, a photoresist pattern is formed on the top surface of the embossed first polysilicon layer 23 by a common photolithography process. Then, the predetermined parts of the embossed first polysilicon 23 are removed by using the photoresist pattern as a mask. Subsequently, a dielectric layer 26 such as an ONO (Oxide-Nitride-Oxide) layer is formed on the entire surface of the resulting structure. A second polysilion layer 27 for a control gate is then deposited on the dielectric layer 26. Predetermined parts of the dielectric layer 26 and the second polysilicon layer 27 are removed through a patterning process and an etching process. Finally, the flash memory device with an increased coupling ratio is completed.

Accordingly, the present invention provides a method for forming floating gates with embossed surface through HF vapor gas, thereby increasing the coupling ratio and improving an efficiency of erase and program operations.

It is noted that this patent claims priority from Korean Patent Application Number 10-2003-0101485, which was filed on Dec. 31, 2003, and is hereby incorporated by reference in its entirety.

Although certain example methods, apparatus and articles of manufacture have been described herein, the scope of coverage of this patent is not limited thereto. On the contrary, this patent covers all methods, apparatus and articles of manufacturing fairly falling within the scope of the appended claims either literally or under the doctrine of equivalents.

What is claimed is:

1. A method of fabricating a flash memory device comprising:
    depositing a first oxide layer on a substrate;
    depositing a first polysilicon layer on the first oxide layer;
    forming a second oxide layer on a top surface and on grain boundaries of the first polysilicon layer;
    removing the second oxide layer;
    performing a heat treatment to make the first polysilicon layer have an embossed shape both on the top surface and on lateral faces of the grain boundaries;
    depositing a dielectric layer on the top of the first polysilicon layer;
    depositing a second polysilicon layer on the entire surface of the dielectric layer; and
    removing some parts of the dielectric layer and the second polysilicon layer through a patterning process and an etching process.

2. The method as defined by claim 1, wherein the second oxide layer is removed by HF vapor gas.

3. A method of fabricating a flash memory device comprising:
    depositing a first oxide layer on a substrate;
    depositing a first polysilicon layer on the first oxide layer;
    forming a second oxide layer on the entire surface of the first polysilicon layer;
    removing the second oxide layer;
    performing a high-temperature vacuum heat treatment to make the first polysilicon layer have an embossed shape;
    depositing a dielectric layer on the top of the first polysilicon layer;
    depositing a second polysilicon layer on the entire surface of the dielectric layer; and
    removing some parts of the dielectric layer and the second polysilicon layer through a patterning process and an etching process.

4. The method as defined by claim 3, wherein the second oxide layer is formed on a top surface and grain boundaries of the first polysilicon layer.

5. The method as defined by claim 3, wherein the second oxide layer is removed by HF.

6. The method as defined by claim 5, wherein the HF vapor gas comprises HF and DIW and has a concentration of HF between 20% and 30%.

7. The method as defined by claim 3, wherein the heat treatment is performed at a temperature between 600° C. and 700° C. at a pressure about 12 mT for 1 hour to 4 hours.

8. A method of fabricating a flash memory device comprising:
   depositing a first oxide layer on a substrate;
   depositing a first polysilicon layer on the first oxide layer;
   forming a second oxide layer on the entire surface of the first polysilicon layer;
   removing the second oxide layer with a mixture of HF and deionized water (DIW) having between 20% and 30% HF;
   heating the first polysilicon layer to provide the first polysilicon layer with an embossed shape;
   depositing a dielectric layer on the first polysilicon layer;
   depositing a second polysilicon layer on the entire surface of the dielectric layer; and
   removing some parts of the dielectric layer and the second polysilicon layer through a patterning process and an etching process.

9. The method as defined by claim 8, wherein the second oxide layer is formed on the top surface and the grain boundaries of the first polysilicon layer.

10. The method as defined by claim 8, wherein the heating is performed at a temperature between 600° C. and 700° C. at a pressure about 12 mT for 1 hour to 4 hours.

11. A method of fabricating a flash memory device comprising:
    depositing a first oxide layer on a substrate;
    depositing a first polysilicon layer on the first oxide layer;
    forming a second oxide layer on the entire surface of the first polysilicon layer;
    removing the second oxide layer;
    heating the first polysilicon layer at a temperature between 600° C. and 700° C. at a pressure about 12 mT for 1 hour to 4 hours to provide the first polysilicon layer with an embossed shape;
    depositing a dielectric layer on the top of the first polysilicon layer;
    depositing a second polysilicon layer on the entire surface of the dielectric layer; and
    removing some parts of the dielectric layer and the second polysilicon layer through a patterning process and an etching process.

12. The method as defined by claim 11, wherein the second oxide layer is formed on the top surface and the grain boundaries of the first polysilicon layer.

13. The method as defined by claim 11, wherein the second oxide layer is removed by HF.

14. The method as defined by claim 2, wherein the HF vapor gas comprises a mixture of HF and deionized water (DIW).

15. The method as defined by claim 14, wherein the HF vapor gas has a concentration of HF between 20% and 30%.

16. The method as defined by claim 1, wherein the heat treatment is performed at a temperature between 600° C. and 700° C.

17. The method as defined by claim 16, wherein the heat treatment is performed at a pressure of about 12 mT.

18. The method as defined by claim 16, wherein the heat treatment is performed for a time of from 1 hour to 4 hours.

* * * * *